(12) United States Patent
Kubota et al.

(10) Patent No.: US 7,385,788 B2
(45) Date of Patent: Jun. 10, 2008

(54) CARRIAGE ASSEMBLY OF A HARD DISK DRIVE

(75) Inventors: Takashi Kubota, Kawasaki (JP); Kenji Kobae, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 306 days.

(21) Appl. No.: 10/990,139

(22) Filed: Nov. 16, 2004

(65) Prior Publication Data

US 2006/0012921 A1    Jan. 19, 2006

(30) Foreign Application Priority Data

Jul. 13, 2004    (JP) ............................. 2004-205715

(51) Int. Cl.
*G11B 21/21*    (2006.01)
*G11B 5/48*    (2006.01)

(52) U.S. Cl. ................................. 360/264.2; 360/245.9

(58) Field of Classification Search ............ 360/264.2, 360/245.8, 245.9; 439/67, 77; 174/254, 174/255, 259
See application file for complete search history.

(56) References Cited

U.S. PATENT DOCUMENTS

| | | | |
|---|---|---|---|
| 5,120,665 A * | 6/1992 | Tsukagoshi et al. .......... 156/64 |
| 6,703,566 B1 | 3/2004 | Shiraishi et al. |
| 6,977,818 B1 * | 12/2005 | Depew ........................ 361/719 |
| 7,116,002 B2 * | 10/2006 | Chao et al. .................. 257/789 |
| 2004/0144563 A1 * | 7/2004 | Shiraishi et al. ............ 174/260 |

FOREIGN PATENT DOCUMENTS

| | | |
|---|---|---|
| EP | 1094693 A2 * | 4/2001 |
| JP | 2002217516 | 8/2002 |
| JP | 2003-031915 | 1/2003 |

* cited by examiner

*Primary Examiner*—William J Klimowicz
(74) *Attorney, Agent, or Firm*—Greer, Burns & Crain, Ltd.

(57) ABSTRACT

A carriage assembly of a hard disk drive is constructed so that the bonding of flying leads of a long tail suspension circuit board and bonding terminals of a flexible printed circuit board can be carried out uniformly and reliably, and the problem of the flying leads breaking when the flying leads are pulled off the bonding terminals does not occur. The flexible printed circuit board is attached to a reinforced part by an adhesive in which spacers with a substantially equal particle diameter are mixed, and the flying leads and the bonding terminals are bonded together by ultrasonic bonding by applying ultrasonic vibration in a state where the flying leads are pressed onto the bonding terminals. In addition, an insulating film is provided on an opposite surface of the flying leads to the surface bonded to the bonding terminals, and during the ultrasonic bonding, ultrasonic vibration is applied in a state where the flying leads are pressed via the insulating film onto the bonding terminals.

6 Claims, 11 Drawing Sheets

FIG. 8A
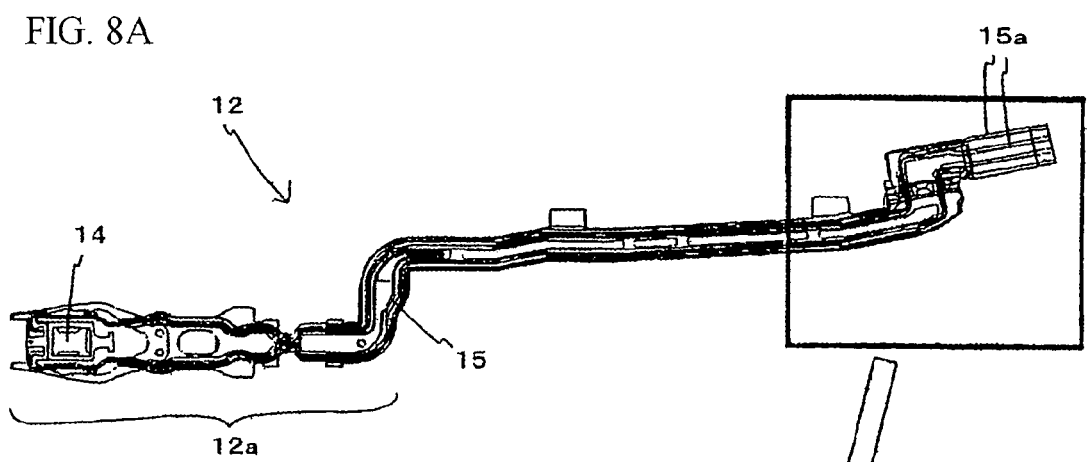
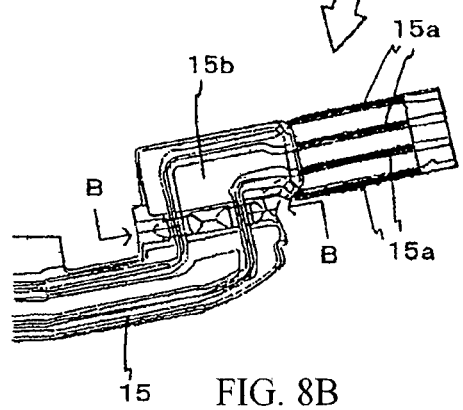
FIG. 8B

CARRIAGE ASSEMBLY OF A HARD DISK DRIVE

BACKGROUND OF THE INVENTION

1. Field of the Invention

The present invention relates to a carriage assembly of a hard disk drive which is provided with a wiring circuit electrically connected to a magnetic head and includes a long tail suspension circuit board where part of the wiring circuit is formed as flying leads and a flexible printed circuit board on which bonding terminals to which the flying leads are bonded are provided.

2. Related Art

In recent years, in the field of hard disk drives (magnetic disk apparatuses), as the recording density of magnetic disks has increased and access speeds have become faster, the construction of a carriage assembly, and in particular the constructions of the suspension and flexible printed circuit board have been rationalized.

More specifically, "suspension circuit boards", where a wiring circuit is formed in advance on the surface or another part of the suspension that supports a magnetic head, are becoming more common. In addition, to improve the bonding reliability by reducing the number of electrical bonds, it is increasingly common to use a so-called "long tail suspension circuit board" where the suspension circuit board extends as far as the flexible printed circuit board for a preamp provided on the carriage assembly and to directly bond the wiring circuit of the suspension circuit board and the flexible printed circuit board for the preamp to one another without a trunk cable or the like in between.

FIG. 9 is a side elevation of a carriage assembly Cx in which the long tail suspension circuit board described above is used.

A carriage main body 10 of the carriage assembly Cx includes a plurality of carriage arms 10a that extend corresponding to recording surfaces of a plurality of magnetic disks (not shown) that are disposed in parallel. Seek operations within planes that are parallel with the surfaces of the magnetic disks are carried out by rotating the carriage main body 10 by rotating an actuator shaft that has a rotational axis on the line A-A in FIG. 9.

Long tail suspension circuit boards 12 are formed as thin stainless steel plates, are disposed inside channels 10b formed along the extending direction of the carriage arms 10a, and are attached to the carriage main body 10. End parts 12a of the long tail suspension circuit boards 12 protrude from and beyond ends of the carriage arms 10a, and magnetic heads 14 are mounted on surfaces of the end parts 12a that face the magnetic disks.

A flexible printed circuit board 16 for a preamp is attached to a reinforced part on one side surface of the carriage main body 10. The flexible printed circuit board 16 is attached to the reinforced part of the carriage main body 10 by an adhesive applied to the reinforced part and a screw 18.

FIG. 8A is a plan view of a long tail suspension circuit board 12.

A wiring circuit 15 electrically connected to a magnetic head 14 is provided on one surface of the long tail suspension circuit board 12. The wiring circuit 15 is provided from a front end 12a, on which the magnetic head 14 is mounted, to the other end on the carriage main body 10 side and is provided along the length of the long tail suspension circuit board 12.

The wiring circuit 15 is normally provided with two signal lines for writes onto a magnetic disk by the magnetic head 14 and two signal lines for reads, making a total of four signal lines.

The front and rear surfaces of the wiring circuit 15 (i.e., a surface facing the thin stainless steel plate described above and an outer surface) are insulated by being covered with an insulating film, such as a polyimide film.

However, at the other end of the long tail suspension circuit board 12, the wiring circuit 15 is formed of flying leads 15a (parts shaded black in FIG. 8B) that are completely exposed from the thin stainless steel plate described above and the insulating film (see FIG. 3 of Japanese Laid-Open Patent Publication No. 2003-31915).

The flying leads 15a are bonding terminals on the long tail suspension circuit board 12 for bonding to bonding terminals 16a of the flexible printed circuit board 16 for the preamp.

FIG. 10 is an enlargement of bonded parts of the bonding terminals 16a and the flying leads 15a.

In order to make the direction in which the respective flying leads 15a are aligned parallel with the printed circuit surface of the flexible printed circuit board 16, a part 12b at the other end of the long tail suspension circuit board 12 is bent at a right angle at the line B-B in FIG. 8B so that the formation surface of the wiring circuit 15 is on the inside, with the flying leads 15a being bonded to the bonding terminals 16a.

The flying leads 15a and the bonding terminals 16a are bonded together by ultrasonic bonding. FIGS. 11A and 11B are cross-sectional views in a direction perpendicular to the direction in which the flying leads 15a extend and show the ultrasonic bonding method.

As shown in FIG. 11A, the flexible printed circuit board 16 is attached on the reinforced part 10c of the carriage main body 10 via an adhesive layer 20. The flying leads 15a of a long tail suspension circuit board 12 are disposed on the bonding terminals 16a of the flexible printed circuit board 16. Next, as shown in FIG. 11B, an ultrasonic tool T is placed in contact with the flying leads 15a and the flying leads 15a are pressed onto the bonding terminals 16a by the ultrasonic tool T. In this state, by applying ultrasonic vibration to the flying leads 15a using the ultrasonic tool T, the flying leads 15a and the bonding terminals 16a are bonded together.

It should be noted that by subjecting the outer surfaces of the flying leads 15a and the bonding terminals 16a to metal plating in advance (see FIG. 3 and Paragraphs 0025 and 0026 of Japanese Laid-Open Patent Publication No. 2003-31915), it is possible to favorably carry out bonding by applying ultrasonic vibration.

In addition, after the ultrasonic bonding, the surfaces of the flying leads 15a that contact the ultrasonic tool T (the upper surfaces of the flying leads 15a in FIG. 11B) become rough due to friction between the surfaces and the ultrasonic tool T, so that it is easy for dust to be produced. Dust present inside a hard disk drive can cause the hard disk drive to malfunction, so that after the ultrasonic bonding, to prevent the production of dust, as shown in FIG. 12, a resin coating 22 that spans the bonding terminals 16a is applied onto the contact surfaces of the flying leads 15a.

Patent Document 1

Japanese Laid-Open Patent Publication No. 2003-31915 (FIG. 3, and Paragraphs 0025 and 0026).

In the conventional carriage assembly Cx, the flexible printed circuit board 16 and the reinforced part 10c of the carriage main body 10 are attached via the adhesive layer 20, so that as shown in FIGS. 11A and 11B, the thickness of the adhesive layer 20 is not uniform. This means that the pressing force of the ultrasonic tool T does not act uniformly on the plurality (in this example, four) flying leads 15a and the bonding terminals 16a, and therefore the transmission of the ultrasonic vibration is also not uniform, resulting in the problem of fluctuations occurring in the electrical bonding strength between the flying leads 15a and the bonding terminals 16a.

Also, during the manufacturing process for a hard disk drive, when a fault is discovered in a test of electrical characteristics and the like of the magnetic heads 14 and the long tail suspension circuit board 12 after the assembly of the carriage assembly Cx, in some cases a replacement process for the long tail suspension circuit board 12 becomes necessary.

In this case, it is necessary to pull the flying leads 15a off the bonding terminals 16a, but as shown in FIG. 12, if the resin coating 22 that spans the bonding terminals 16a is applied onto the contact surfaces of the flying leads 15a, it will be necessary to apply, to the flying leads 15a, not only enough force to pull the flying leads 15a off the bonding terminals 16a but also enough force to pull the resin coating 22 off the bonding terminals 16a. This means that there are cases where the application of a large force to the flying leads 15a causes the flying leads 15a to break, resulting in the problem that replacement becomes no longer possible or the replacement process becomes difficult.

SUMMARY OF THE INVENTION

The present invention was conceived to solve the problems described above, and it is an object of the present invention to provide a carriage assembly of a hard disk drive for which the bonding of flying leads of a long tail suspension circuit board and bonding terminals of a flexible printed circuit board can be carried out uniformly and reliably, and for which the problem of the flying leads breaking when the flying leads are pulled off the bonding terminals does not occur.

In order to solve the above problems, the present invention is a carriage assembly of a hard disk drive, including: a carriage main body provided so as to be capable of rotating about an actuator shaft; a long tail suspension circuit board which is attached to the carriage main body, on whose end a magnetic head is mounted, and on which a wiring circuit that is electrically connected to the magnetic head is provided, part of the wiring circuit being formed by a flying lead; and a flexible printed circuit board which is attached to a reinforced part provided on the carriage main body and on which a bonding terminal that is bonded to the flying lead is provided, wherein the flexible printed circuit board is attached to the reinforced part by adhesive in which spacers of a substantially equal particle size have been mixed, and the flying lead and the bonding terminal are bonded together by ultrasonic bonding by applying ultrasonic vibration in a state where the flying lead is pressed onto the bonding terminal.

With the above construction, when the flying lead is pressed onto the bonding terminal by an ultrasonic tool or the like and ultrasonic vibration is applied, the thickness of the adhesive layer between the flexible printed circuit board and the reinforced part is made uniform at the particle diameter of the spacers, so that the pressing force of an ultrasonic tool or the like acts uniformly on the flying lead and the bonding terminal and the bonding of the flying lead and the bonding terminal is carried out uniformly and reliably.

In addition, the adhesive may be composed of a thermoplastic material.

With this construction, by applying heat during the ultrasonic bonding of the flying lead and the bonding terminal, the fluidity of the adhesive is increased, or deformation of the adhesive layer is facilitated, so that it becomes possible to make the thickness of the adhesive layer more uniform.

In addition, an insulating layer may be provided on an opposite surface of the flying lead to a surface bonded to the bonding terminal, and during the ultrasonic bonding, the ultrasonic vibration may be applied in a state where the flying lead is pressed via the insulating layer onto the bonding terminal.

Another carriage assembly of a hard disk drive according to the present invention includes: a carriage main body provided so as to be capable of rotating about an actuator shaft; a long tail suspension circuit board which is attached to the carriage main body, on whose end a magnetic head is mounted, and on which a wiring circuit that is electrically connected to the magnetic head is provided, part of the wiring circuit being formed by a flying lead; and a flexible printed circuit board which is attached to a reinforced part provided on the carriage main body and on which a bonding terminal that is bonded to the flying lead is provided, wherein an insulating film is provided on an opposite surface of the flying lead to a surface bonded to the bonding terminal, and the flying lead and the bonding terminal are bonded together by ultrasonic bonding by applying ultrasonic vibration in a state where the flying lead is pressed via the insulating film onto the bonding terminal.

With this construction, the flying leads are reinforced by the insulating film and therefore become difficult to break. In addition, non-uniformity in the gap between the flexible printed circuit board (the bonding terminal) and the reinforced part is absorbed by the insulating film, so that a pressing force applied by an ultrasonic tool or the like acts uniformly on the flying lead and the bonding terminal and the flying lead and the bonding terminal can be bonded uniformly and reliably.

In addition, the insulating film may be composed of a thermoplastic material.

With this construction, by applying heat during the ultrasonic bonding of the flying lead and the bonding terminal, deformation of the insulating film is facilitated, so that non-uniformity in the gap between the flexible printed circuit board (the bonding terminal) and the reinforced part is absorbed.

An insulating layer, in which an opening has been formed at a position corresponding to a part bonded to the bonding terminal, may be provided on an opposite surface of the flying lead to a surface bonded to the bonding terminal, the flying lead and the bonding terminal may be bonded together by ultrasonic bonding by applying ultrasonic vibration in a state where the flying lead is pressed via the opening onto the bonding terminal, and after the ultrasonic bonding has been carried out, a coating that covers the opening may be applied.

Another carriage assembly of a hard disk drive according to the present invention includes: a carriage main body provided so as to be capable of rotating about an actuator shaft; a long tail suspension circuit board which is attached to the carriage main body, on whose end a magnetic head is mounted, and on which a wiring circuit that is electrically connected to the magnetic head is provided, part of the wiring circuit being formed by a flying lead; and a flexible printed circuit board which is attached to a reinforced part provided on the carriage main body and on which a bonding terminal that is bonded to the flying lead is provided, wherein an insulating film is provided on an opposite surface of the flying lead to a surface bonded to the bonding terminal, an opening being formed in the insulating film at a position corresponding to a part bonded to the bonding terminal, the flying lead and the bonding part are bonded together by ultrasonic bonding by applying ultrasonic vibration in a state where the flying lead is pressed via the opening onto the bonding terminal, and after the ultrasonic bonding has been carried out, a coating that covers the opening is applied.

With this construction, the flying lead is reinforced by the insulating film and becomes difficult to break. In addition, since the coating is formed so as to span the flying lead and the insulating film, when the flying lead is pulled off the bonding terminal, the force that pulls the coating off the bonding terminal does not act on the flying lead and therefore the flying lead does not break.

In addition, a gold plating layer may be formed on a surface of the flying lead that is bonded to the bonding terminal, and an outermost conductive layer on an opposite surface of the flying lead to the surface that is bonded may be formed by a nickel plating layer.

With this construction, a nickel plating layer that is harder than a conventional gold plating layer is formed on an opposite surface, to which the ultrasonic vibration is applied, of the flying lead to the bonding surface, so that the ultrasonic vibration can be transmitted more easily to the flying lead and the bonding strength of the flying lead and the bonding terminal can be increased.

The long tail suspension circuit board may have a plurality of the flying leads that extend substantially in parallel to each other, and the insulating film may be provided so as to span the plurality of the flying leads.

With this construction, an insulating film with a uniform thickness can be formed easily.

The insulating film may be formed integrally with an insulating film provided between a main part of the long tail suspension circuit board and the wiring circuit.

With this construction, during the formation of the flying leads, it is possible, at parts where flying leads are to be formed, to construct the insulating film easily and at a low cost by simply not performing a removing process for an insulating film provided between a main body of the long tail suspension circuit board and a wiring circuit.

Another carriage assembly of a hard disk drive according to the present invention includes: a carriage main body provided so as to be capable of rotating about an actuator shaft; a long tail suspension circuit board which is attached to the carriage main body, on whose end a magnetic head is mounted, and on which a wiring circuit that is electrically connected to the magnetic head is provided, part of the wiring circuit being formed by a flying lead; and a flexible printed circuit board which is attached to a reinforced part provided on the carriage main body and on which a bonding terminal that is bonded to the flying lead is provided, wherein a gold plating layer is formed on a surface of the flying lead that is bonded to the bonding terminal, and an outermost conductive layer on an opposite surface of the flying lead to the surface that is bonded may be formed by nickel plating layer.

With this construction, a nickel plating layer that is harder than a conventional gold plating layer is formed on an opposite surface, to which the ultrasonic vibration is applied, of the flying lead to the bonding surface, so that the ultrasonic vibration can be transmitted more easily to the flying lead and the bonding strength of the flying lead and the bonding terminal can be increased.

The long tail suspension circuit board may have a plurality of the flying leads that extend substantially in parallel to each other, and the ultrasonic bonding may be achieved by applying the ultrasonic vibration in a state where the plurality of the flying leads are simultaneously pressed onto a plurality of the bonding terminals.

According to the present invention, it is possible to uniformly and reliably bond the flying leads of a long tail suspension circuit board and the bonding terminals of a flexible printed circuit board, so that the problem of the flying leads breaking when the flying leads are pulled off the bonding terminals does not occur.

BRIEF DESCRIPTION OF THE DRAWINGS

The aforementioned and other objects and advantages of the present invention will become apparent to those skilled in the art upon reading and understanding the following detailed description with reference to the accompanying drawings.

In the drawings:

FIGS. 8A and 8B are diagrams showing the long tail suspension circuit board;

DESCRIPTION OF THE PREFERRED EMBODIMENTS

Preferred embodiments of the present invention will now be described in detail with reference to the attached drawings.

First Embodiment

Figure 1:
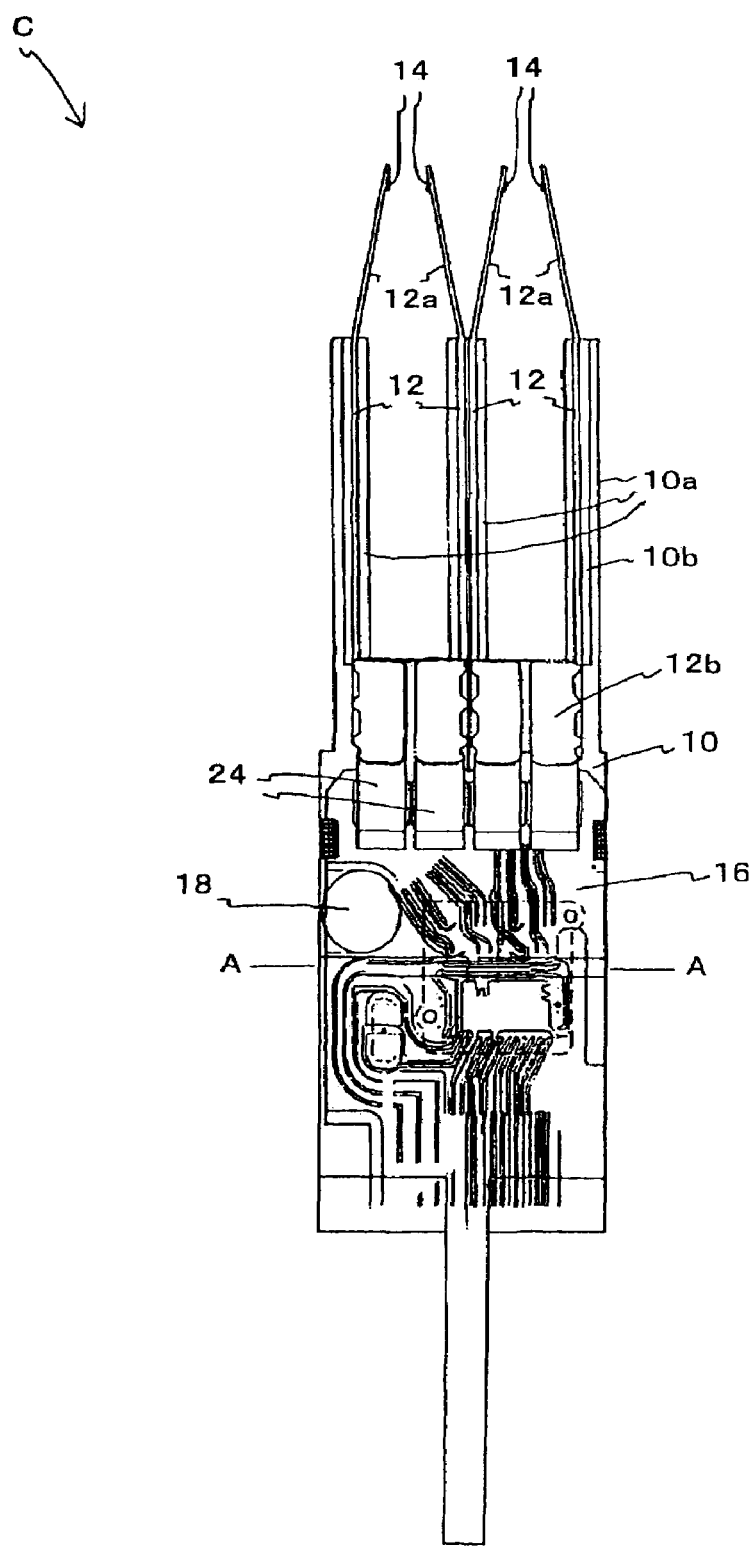
FIG. 1 is a diagram showing a carriage assembly of a hard disk drive according to a first embodiment of the present invention.

FIG. 1 is a side elevation of a carriage assembly C according to a first embodiment of the present invention.

It should be noted that parts of the construction that are the same as in the conventional carriage assembly Cx have been assigned the same reference numerals and description of such has been omitted.

In the carriage assembly C of this first embodiment, an insulating film 24 that is elastic is provided on an opposite side of the flying leads 15a to a surface that is bonded to the bonding terminals 16a.

The method of forming the insulating film 24 will now be described with reference to FIGS. 2A and 2B.

Figure 2A:
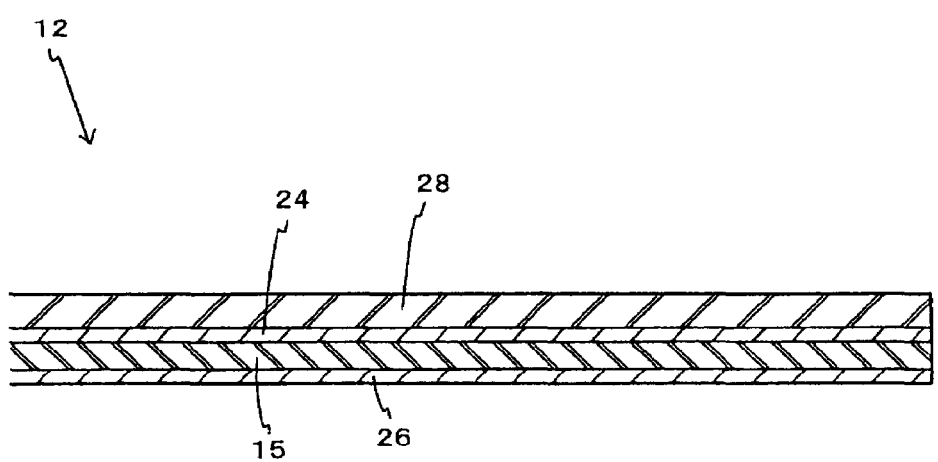
FIGS. 2A and 2B are diagrams useful in explaining a method of forming flying leads in the first embodiment, with FIG. 2A showing a long tail suspension circuit board in a state before the flying leads are formed and FIG. 2B showing a state after the flying leads have been formed.

FIG. 2A is a partial cross-sectional view in the lengthwise direction at a carriage main body 10 end of a long tail suspension circuit board 12 before the flying leads 15a are formed. The long tail suspension circuit board 12 includes a stainless steel plate 28, the wiring circuit 15, the insulating film 24 that insulates the stainless steel plate 28 and the wiring circuit 15 from each other, and an insulating film 26 that insulates an outer surface of the wiring circuit 15.

The insulating films 24, 26 are formed from a resin such as polyimide.

Figure 2B:
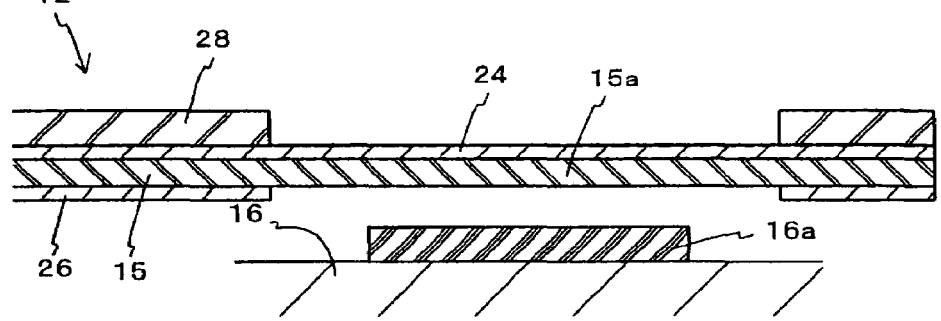

When manufacturing the carriage assembly C of the first embodiment, as shown in FIG. 2B, the flying leads 15a are formed by removing the stainless steel plate 28 and the insulating film 26 at suitable parts of the long tail suspension circuit board 12. By removing the insulating film 26, a plurality of flying leads 15a that extend parallel to each other are exposed and formed. The insulating film 24 is not removed and is left so as to span the plurality of flying leads 15a.

Figure 11A:
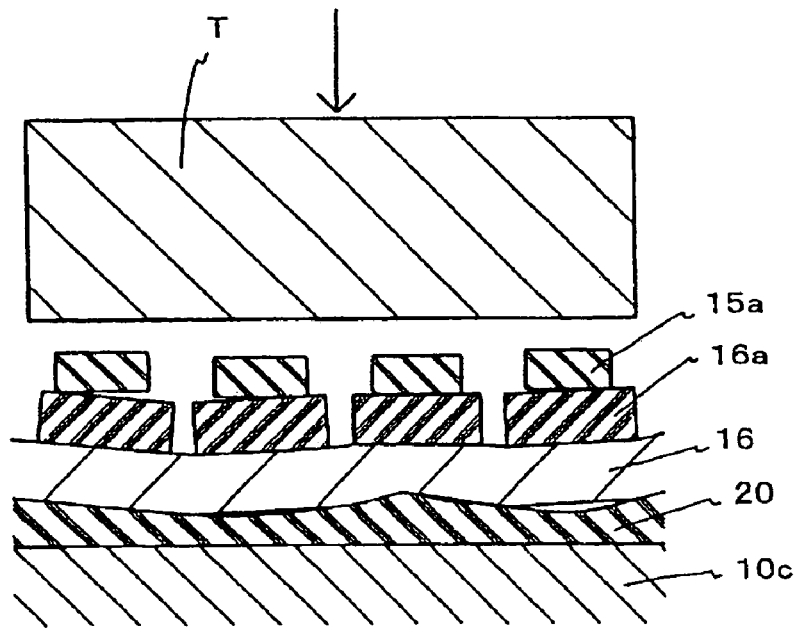
FIGS. 11A and 11B are diagrams useful in showing the state during bonding of the flying leads and the bonding terminals according to the related art, with FIG. 11A showing the state before the flying leads are pressed onto the bonding terminals and FIG. 11B showing the state where the flying leads are pressed onto the bonding terminals and ultrasonic vibration is applied.
Figure 11B:
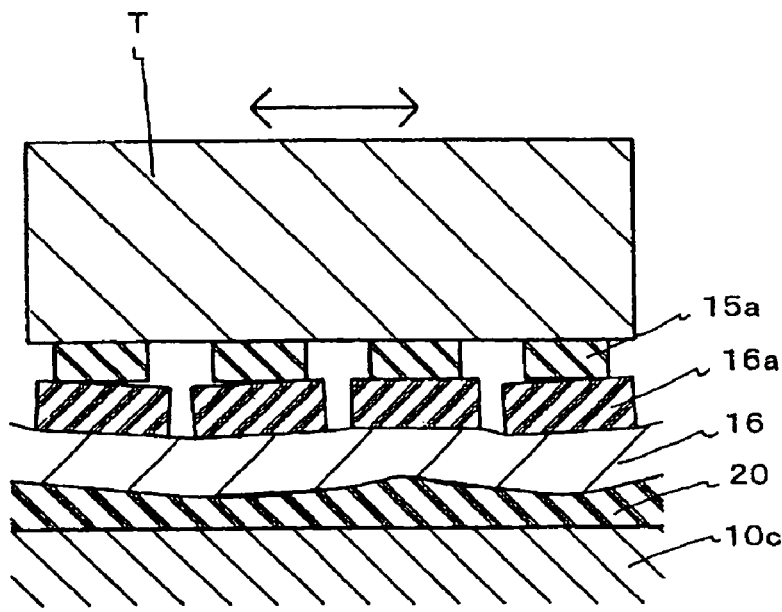
Figure 12:
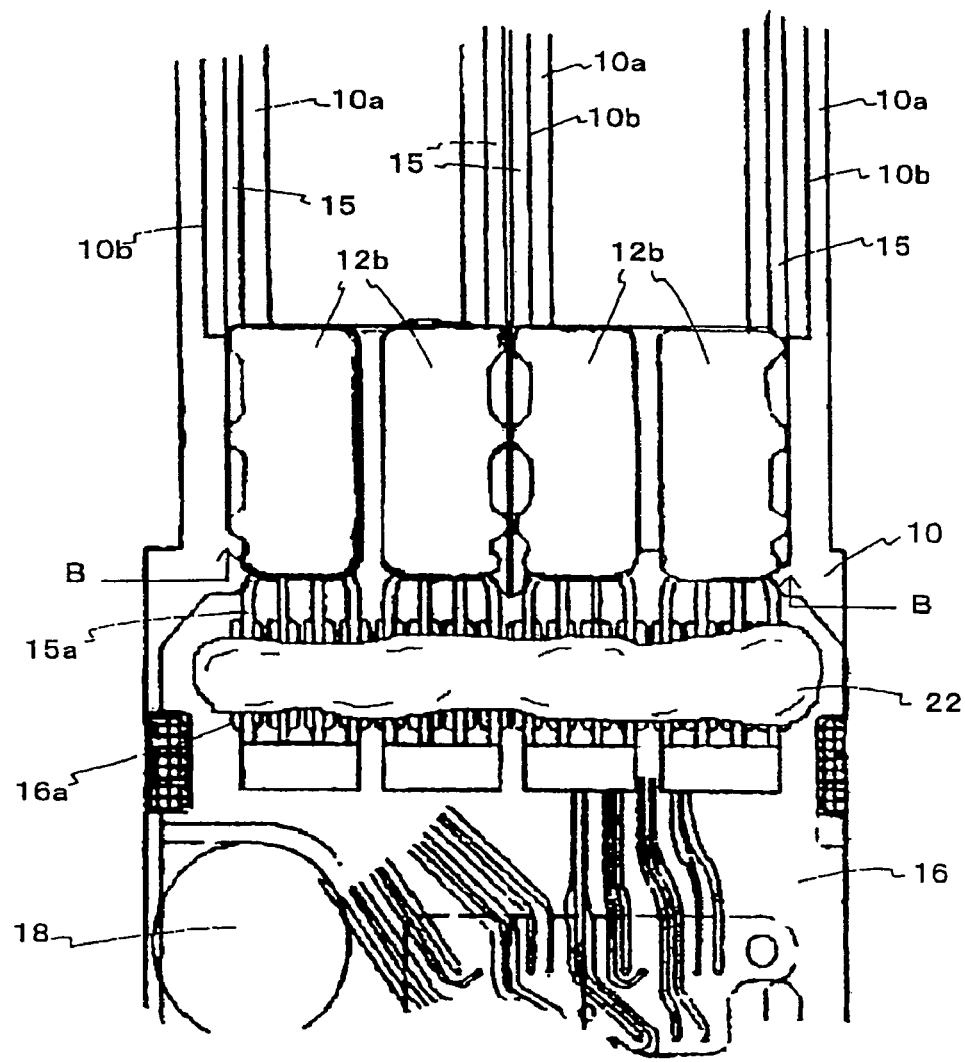
FIG. 12 is an enlargement of the bonded parts of the bonding terminals and the flying leads of a conventional carriage assembly.

It should be noted that as shown in FIG. 11, in the related art, the flying leads are formed by also removing the insulating film 24 that insulates the stainless steel plate 28 and the wiring circuit 15 from each other.

Figure 3A:
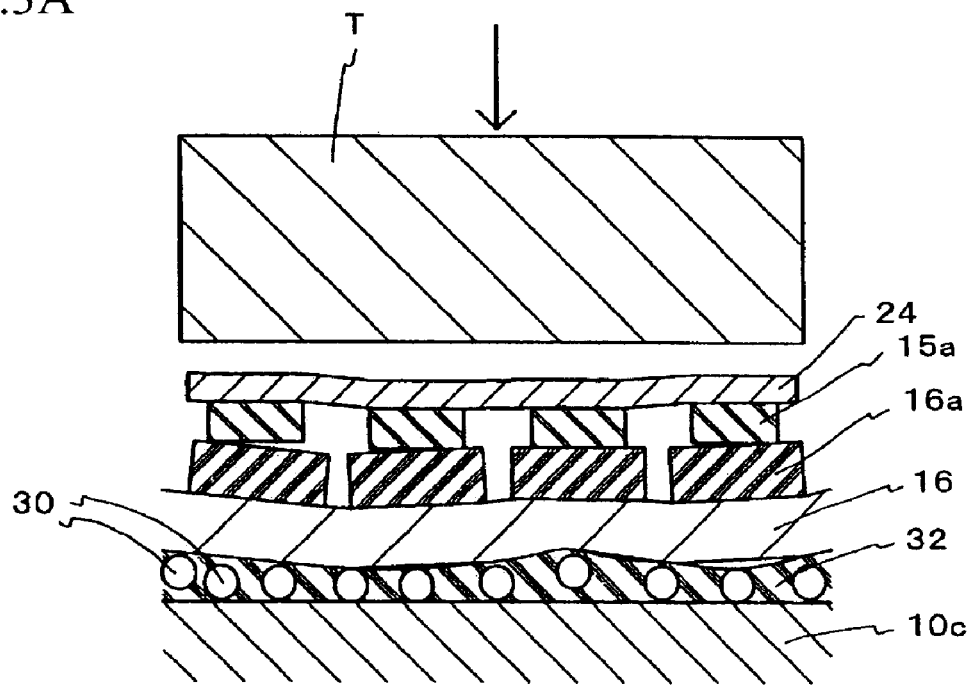
FIGS. 3A and 3B are diagrams useful in explaining a state where the flying leads and the bonding terminals are bonded together, with FIG. 3A showing a state before the flying leads are pressed onto the bonding terminals and FIG. 3B showing a state where the flying leads are pressed onto the bonding terminals and ultrasonic vibration is applied.

In addition, in this first embodiment, as shown in FIG. 3A, the flexible printed circuit board 16 is attached to the reinforced part 10c by an adhesive layer 32 composed of an adhesive in which rigid spacers 30 that have a substantially equal particle diameter have been mixed.

Figure 3B:
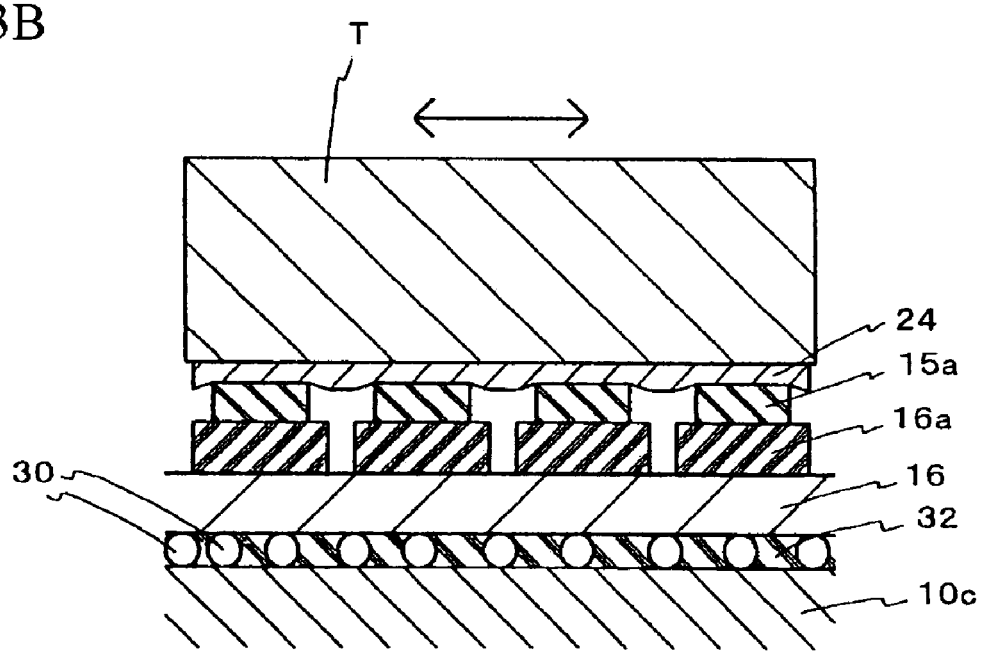

In the carriage assembly C of this first embodiment, when the flying leads 15a and the bonding terminals 16a are bonded together, as shown in FIGS. 3A and 3B (cross-sectional views taken in a direction perpendicular to the lengthwise direction of the flying leads 15a), an ultrasonic tool T is pressed onto the flying leads 15a via the insulating film 24 that is provided on the opposite surface of the flying leads 15a to the surface that is bonded to the bonding terminals 16a. In this state, ultrasonic vibration is applied to the flying leads 15a by the ultrasonic tool T.

According to the construction of the first embodiment, when the flying leads 15a are pressed onto the bonding terminals 16a by the ultrasonic tool T, the rigid spacers 30 of the substantially equal diameter become pressed on both sides between the flexible printed circuit board 16 and the reinforced part 10c, so that the thickness of the adhesive layer 32 becomes uniform at the particle diameter of the spacers 30, and as a result, the bonding terminals 16a and the flying leads 15a become parallel with the surface of the reinforced part 10c. This means that the pressing force of the ultrasonic tool T acts uniformly on the flying leads 15a and the bonding terminals 16a, so that the flying leads 15a and the bonding terminals 16a are uniformly and reliably bonded together.

In addition, if the adhesive that composes the adhesive layer 32 is made up of a thermoplastic material, by applying heat during the ultrasonic bonding of the flying leads 15a and the bonding terminals 16a, the fluidity of the adhesive in the adhesive layer 32 is increased, which facilitates deformation of the adhesive layer 32 so that the thickness of the adhesive layer 32 can be made more uniform.

In addition, since the insulating film 24 is provided on the opposite surface of the flying leads 15a to the surface that is bonded to the bonding terminals 16a, the flying leads 15a are reinforced by the insulating film 24 and therefore are more difficult to break. Since fluctuations in the gap between the flexible printed circuit board 16 (the bonding terminals 16a) and the reinforced part 10c are absorbed by the insulating film 24 that is elastic, the pressing force of the ultrasonic tool T acts uniformly on the flying leads 15a and the bonding terminals 16a, so that the flying leads 15a and the bonding terminals 16a are bonded more uniformly and reliably.

In addition, if the insulating film 24 is formed of a thermoplastic material, by applying heat during the ultrasonic bonding of the flying leads 15a and the bonding terminals 16a, deformation of the insulating film 24 is facilitated, which increases the alignment effect so that the pressing force can act more uniformly on the flying leads 15a and the bonding terminals 16a.

Also, since the ultrasonic tool T is placed in contact via the insulating film 24 that is elastic, unlike the related art there is no production of metal dust and the like at the part that contacts the ultrasonic tool T, so that there is no need for the conventional resin coating or the like, which means that the manufacturing cost and the material cost can be reduced.

In addition, the insulating film 24 is formed by leaving an insulating layer that is provided from the outset between the main part (the stainless steel plate 28) of the long tail suspension circuit board 12 and the wiring circuit 15, so that the insulating film 24 does not have to be provided separately and a simple, low-cost construction can be used.

It should be obvious that the present invention is not limited to the construction described above and the insulating film 24 may be provided separately.

Second Embodiment

Next, a second embodiment of the present invention will be described.

It should be noted that parts of the construction that are the same as in the carriage assembly C of the first embodiment or the conventional carriage assembly Cx have been assigned the same reference numerals, description of such has been omitted, and only the differences will be described below.

Figure 4:
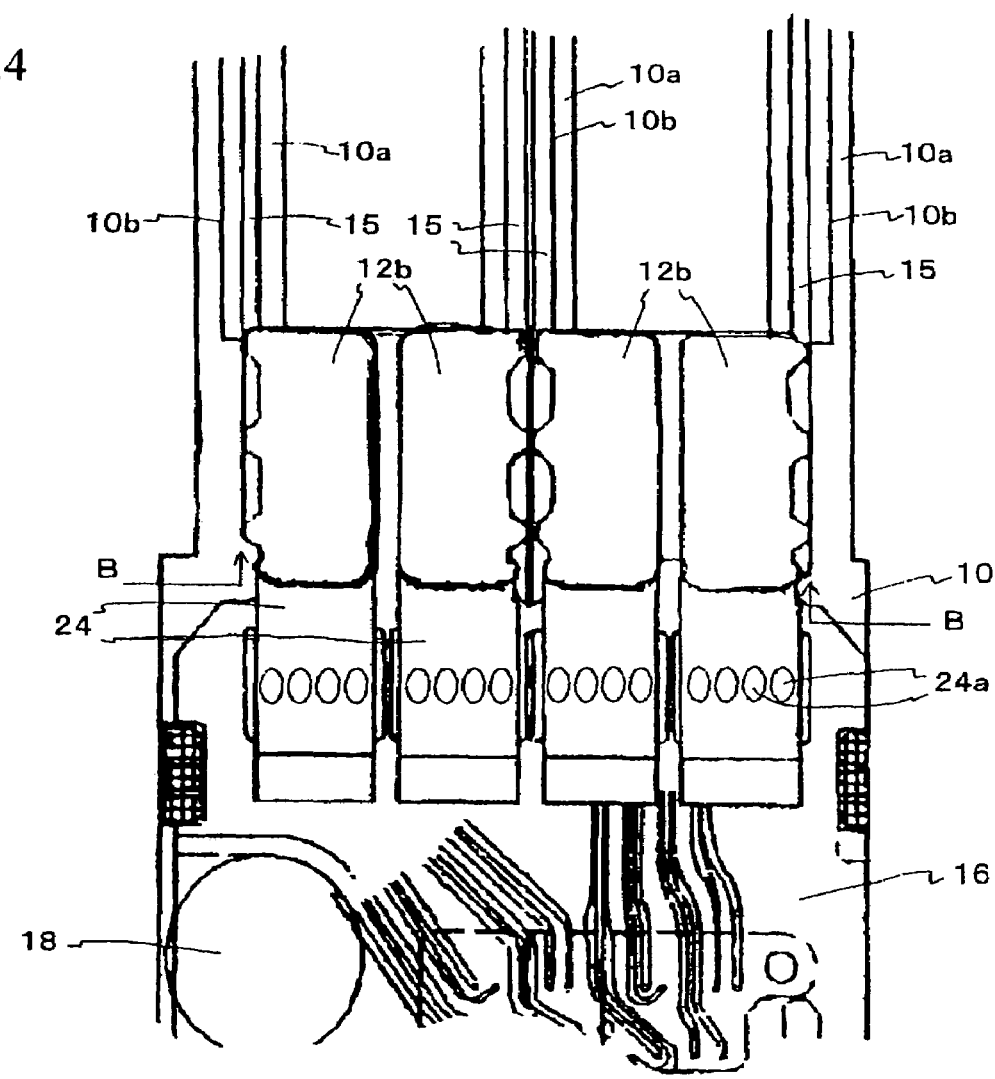
FIG. 4 is an enlargement of bonded parts of the bonding terminals and flying leads in the carriage assembly according to the first embodiment.

As shown in FIG. 4, in the second embodiment, openings 24a are formed in the insulating film 24 of the first embodiment, which is provided on an opposite surface of the flying leads 15a to the surface bonded to the bonding terminals 16a, at positions corresponding to the parts bonded to the bonding terminals 16a. The openings 24a are formed so as to respectively correspond to the individual flying leads 15a and the bonding terminals 16a.

Figure 5A:
FIGS. 5A and 5B are diagrams useful in showing the method of forming openings in an insulating film of a second embodiment, with FIG. 5A showing the state of a long tail suspension circuit board before the formation of the openings and FIG. 5B showing a state after the formation of the openings.

In this second embodiment, as shown in FIG. 5A (which is similar to FIG. 2B of the first embodiment) the flying leads 15a are formed by removing the stainless steel plate 28 and the insulating film 26 at suitable parts of the long tail suspension circuit board 12. The insulating film 24 is not removed and is left so as to span the plurality of flying leads 15a.

Figure 5B:
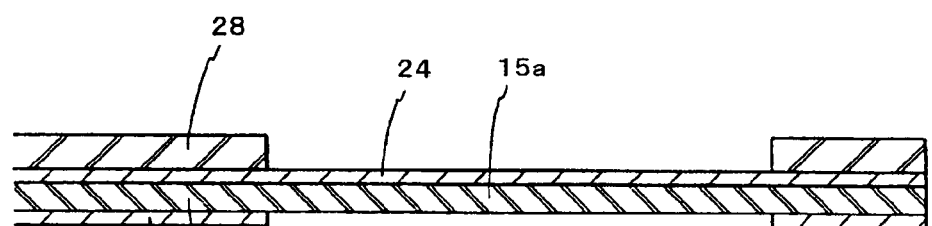

Next, as shown in FIG. 5B, the insulating film 24 is removed at positions corresponding to the bonded parts of the flying leads 15a and the bonding terminals 16a to form the openings 24a.

In addition, this second embodiment is characterized by the composition of the flying leads 15a (the wiring circuit 15).

Figure 6A:
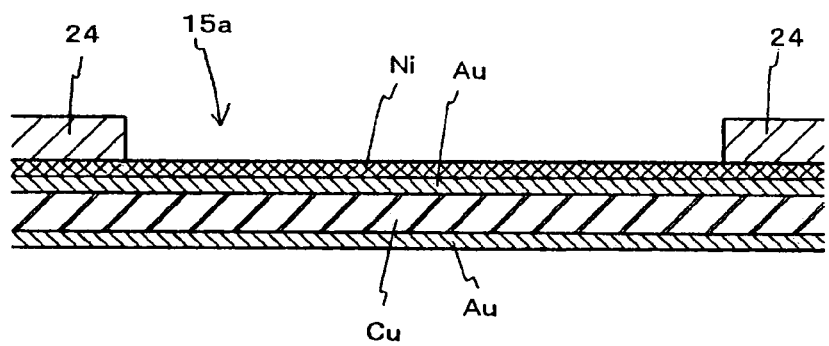
FIGS. 6A and 6B are diagrams that show the construction of the flying leads in the second embodiment.

As shown in FIG. 6A, the flying leads 15a (the wiring circuit 15) of the carriage assembly of this second embodiment have gold (Au) plating layers formed on both surfaces of a copper (Cu) core layer. In addition, by carrying out nickel (Ni) plating on only the opposite surface of the flying leads 15a to the surface bonded to the bonding terminals 16a, a conductive layer on the outermost side of this opposite surface (the uppermost layer in FIG. 6A) is formed by a nickel plating layer.

Figure 6B:
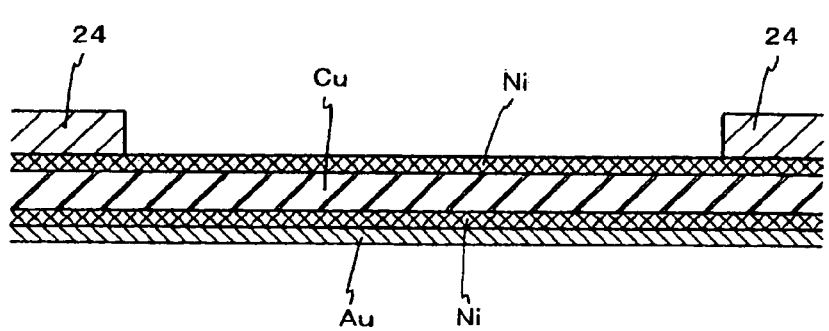

Alternatively, as shown in FIG. 6B, nickel plating layers may be formed on both surfaces of the copper core layer and gold plating may be carried out on only the bonded surface to form a gold plating layer.

In this second embodiment, the ultrasonic tool T is placed in contact with the flying leads 15a via the openings 24a and ultrasonic bonding is carried out by applying ultrasonic vibration in a state where the flying leads 15a are pressed onto the bonding terminals 16a.

Figure 7:
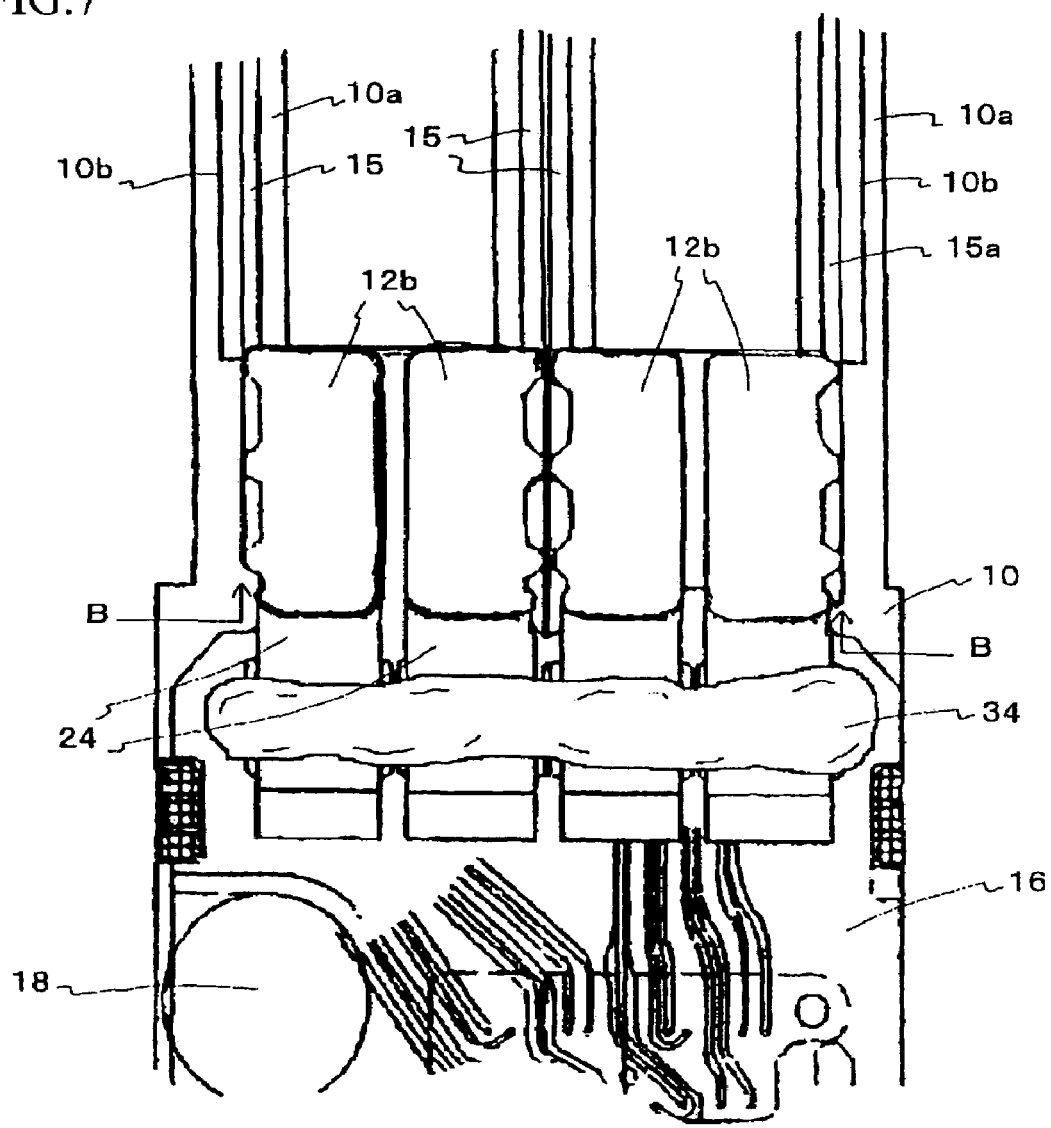
FIG. 7 is an enlargement of bonded parts of the bonding terminals and the flying leads of the carriage assembly according to the second embodiment.
Figure 9:
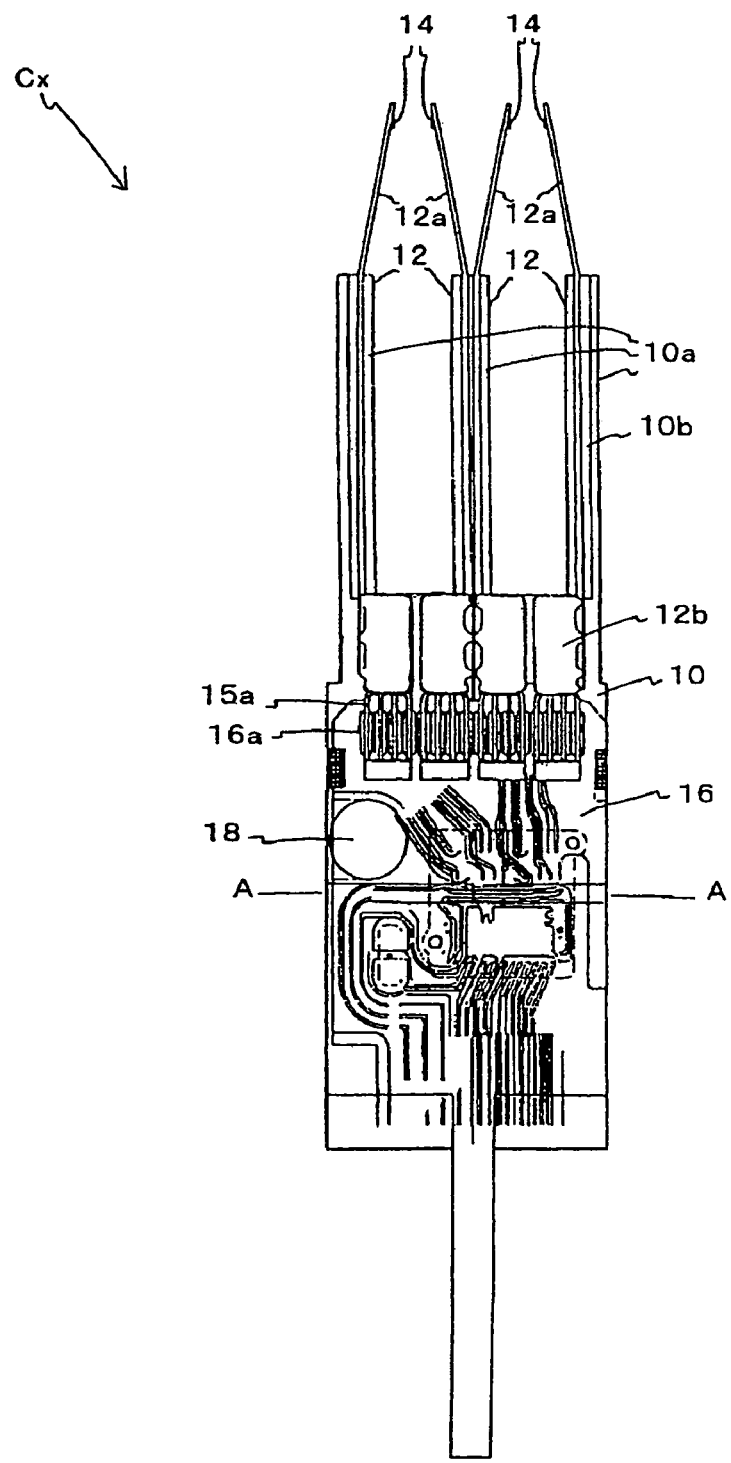
FIG. 9 is a diagram showing a carriage assembly of a conventional hard disk drive.
Figure 10:
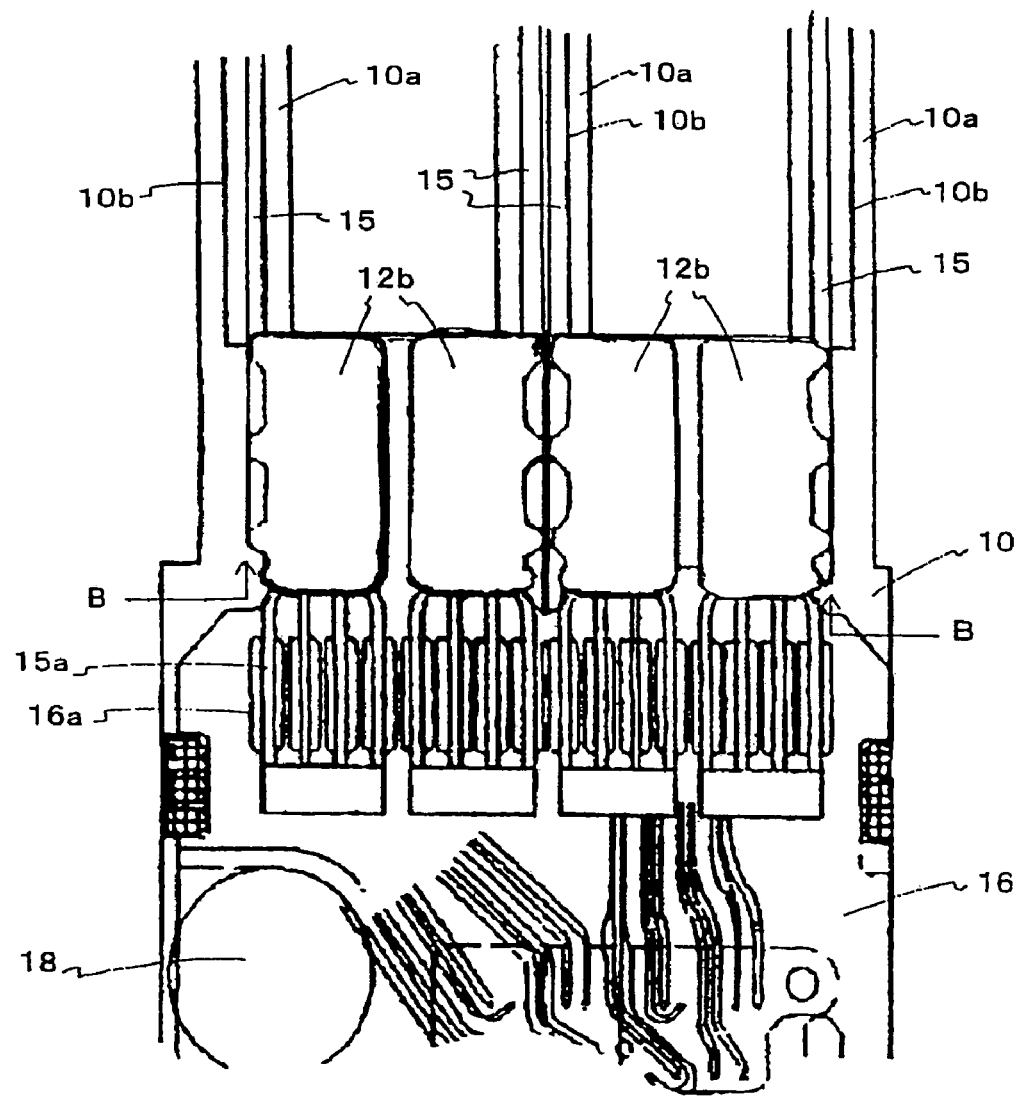
FIG. 10 is an enlargement of bonded parts of the bonding terminals and the flying leads of a conventional carriage assembly.

After the ultrasonic bonding, since the parts where the flying leads 15a contact the ultrasonic tool T are roughened by the application of the ultrasonic vibration, as shown in FIG. 7, a resin coating 34 is applied so as to cover the openings 24a.

According to the carriage assembly of this second embodiment, since the resin coating 34 is formed on the flying leads 15a and the insulating film 24 and hardly sticks to the bonding terminals 16a, unlike a conventional resin coating, when the flying leads 15a are pulled off the bonding terminals 16a, a force that pulls the resin coating 34 off the bonding terminals 16a is not applied to the flying leads 15a and the flying leads 15a do not break.

Also, in the related art, a conductive layer, such as metal plating, with favorable bonding characteristics for ultrasonic bonding is formed on the surfaces of the flying leads. However, when an ultrasonic tool is placed in contact with a soft metal layer, such as a metal plating layer, and ultrasonic vibration is applied, there is the problem of the metal layer deforming or being otherwise affected so that the ultrasonic vibration of the ultrasonic tool is not favorably transmitted to the flying leads.

As a result, in this second embodiment, the opposite surface of the flying leads 15a to the bonding surface which is contacted by the ultrasonic tool T and to which the ultrasonic vibration is applied is formed by a hard nickel plating layer, so that it becomes easier to transmit the ultrasonic vibration to the flying leads and the bonding strength of the bonds between the flying leads and the bonding terminals is increased.

What is claimed is:

1. A carriage assembly of a hard disk drive, comprising:
   a carriage main body provided so as to be capable of rotating about an actuator shaft;
   a long tail suspension circuit board which is attached to the carriage main body, on whose end a magnetic head is mounted, and on which a wiring circuit that is electrically connected to the magnetic head is provided, part of the wiring circuit being formed by a flying lead; and
   a flexible printed circuit board which is attached to a reinforced part provided on the carriage main body and on which a bonding terminal that is bonded to the flying lead is provided,
   wherein the flexible printed circuit board is attached to the reinforced part by adhesive in which spacers of a substantially equal particle size have been mixed, and
   the flying lead and the bonding terminal are bonded together by ultrasonic bonding by applying ultrasonic vibration in a state where the flying lead is pressed onto the bonding terminal.

2. A carriage assembly of a hard disk drive according to claim 1,
   wherein the adhesive is composed of a thermoplastic material.

3. A carnage assembly of a hard disk drive according to claim 1,
   wherein an insulating layer is provided on an opposite surface of the flying lead to a surface bonded to the bonding terminal, and
   during the ultrasonic bonding, the ultrasonic vibration is applied in a state where the flying lead is pressed via the insulating layer onto the bonding terminal.

4. A carriage assembly of a hard disk drive according to claim 1,
   wherein an insulating layer, in which an opening has been formed at a position corresponding to a part bonded to the bonding terminal, is provided on an opposite surface of the flying lead to a surface bonded to the bonding terminal,
   the flying lead and the bonding terminal are bonded together by ultrasonic bonding by applying ultrasonic vibration in a state where the flying lead is pressed via the opening onto the bonding terminal, and
   after the ultrasonic bonding has been carried out, a coating that covers the opening is applied.

5. A carriage assembly of a hard disk drive according to claim 1,
   wherein a gold plating layer is formed on a surface of the flying lead that is bonded to the bonding terminal, and
   an outermost conductive layer on an opposite surface of the flying lead to the surface that is bonded is formed by a nickel plating layer.

6. A carriage assembly of a hard disk drive according to claim 1,
   wherein the long tail suspension circuit board has a plurality of the flying leads that extend substantially in parallel to each other,
   and the ultrasonic bonding is carried out by applying the ultrasonic vibration in a state where the plurality of the flying leads are simultaneously pressed onto a plurality of the bonding terminals.

* * * * *